US008871533B2

(12) United States Patent
Jin et al.

(10) Patent No.: US 8,871,533 B2
(45) Date of Patent: Oct. 28, 2014

(54) METHOD FOR MAKING SOLAR CELL AND SOLAR CELL SYSTEM

(75) Inventors: Yuan-Hao Jin, Beijing (CN); Qun-Qing Li, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 307 days.

(21) Appl. No.: 13/556,279

(22) Filed: Jul. 24, 2012

(65) Prior Publication Data

US 2013/0171758 A1    Jul. 4, 2013

(30) Foreign Application Priority Data

Dec. 29, 2011   (CN) .......................... 2011 1 0450133

(51) Int. Cl.
*H01L 21/00*   (2006.01)
(52) U.S. Cl.
USPC .......... 438/19; 438/68; 438/74; 257/E27.124; 257/E31.038; 136/261
(58) Field of Classification Search
USPC ......... 257/E27.124, E31.038; 438/19, 68, 74, 438/113, 460; 136/261, 256
See application file for complete search history.

(56) References Cited

U.S. PATENT DOCUMENTS

| 3,422,527 | A | 1/1969 | Gault |
| 4,131,984 | A | 1/1979 | Kaplow et al. |
| 6,744,073 | B1 | 6/2004 | Nakata |
| 8,450,717 | B1 | 5/2013 | Samuelson et al. |
| 2003/0005954 | A1 | 1/2003 | Emoto et al. |
| 2005/0178431 | A1 | 8/2005 | Yang et al. |
| 2006/0043390 | A1 | 3/2006 | Nakata |
| 2008/0185033 | A1 | 8/2008 | Kalejs |
| 2008/0303131 | A1 | 12/2008 | McElrea et al. |
| 2009/0211633 | A1 | 8/2009 | Schilinsky et al. |
| 2010/0018579 | A1 | 1/2010 | Curram |

(Continued)

FOREIGN PATENT DOCUMENTS

| CN | 1373907 | 10/2002 |
| JP | 53-66390 | 6/1978 |

(Continued)

OTHER PUBLICATIONS

K.S.Lee et al., "Transferred vetically aligned N-doped carbon nanotube arrays:use in dye-sensitized solar cell as counter electrodes", Chemical, vol. 47, No. 14,pp. 4264-4266, Apr. 14, 2011.

*Primary Examiner* — David Vu
(74) *Attorney, Agent, or Firm* — Novak Druce Connolly Bove + Quigg LLP

(57) ABSTRACT

A solar cell making method includes steps of making a round P-N junction preform by (a) stacking a P-type silicon layer and a N-type silicon layer on top of each other, and (b) forming a P-N junction near an interface between the P-type silicon layer and the N-type silicon layer, wherein the round P-N junction preform defines a first surface and a second surface; forming a first electrode preform on the first surface and forming a second electrode preform on the second surface, thereby forming a round solar cell preform; and forming a photoreceptive surface with the P-N junction exposed on the photoreceptive surface by cutting the round solar cell preform into a plurality of arc shaped solar cells, the photoreceptive surface being on a curved surface of the arc shaped solar cell and being configured to receive incident light beams.

18 Claims, 14 Drawing Sheets

(56) References Cited

U.S. PATENT DOCUMENTS

| | | |
|---|---|---|
| 2011/0168246 A1 | 7/2011 | Tsai |
| 2012/0152322 A1 | 6/2012 | Kribus et al. |
| 2012/0152340 A1 | 6/2012 | Kondo et al. |
| 2012/0266953 A1 | 10/2012 | Borrello et al. |

FOREIGN PATENT DOCUMENTS

| | | |
|---|---|---|
| JP | 62-105485 | 5/1987 |
| JP | 1-111887 | 4/1989 |
| JP | 11-298023 | 10/1999 |
| JP | 2001-313401 | 11/2001 |
| JP | 2002-94099 | 3/2002 |
| JP | 2006-73985 | 3/2006 |
| JP | 2011-86647 | 4/2011 |
| TW | 200406814 | 5/2004 |
| TW | 200913208 | 3/2009 |
| TW | 201113389 | 4/2011 |
| TW | M416877 | 11/2011 |
| WO | WO03094248 | 11/2003 |
| WO | WO2004036658 | 4/2004 |
| WO | WO2010134019 | 11/2010 |
| WO | WO2011024534 | 3/2011 |

METHOD FOR MAKING SOLAR CELL AND SOLAR CELL SYSTEM

CROSS-REFERENCE TO RELATED APPLICATIONS

This application claims all benefits accruing under 35 U.S.C. §119 from China Patent Application No. 201110450096.8, filed on Dec. 29, 2011, in the China Intellectual Property Office, the contents of which are hereby incorporated by reference. This application is related to applications entitled, "SOLAR CELL AND SOLAR CELL SYSTEM", filed Jul. 24, 2012 (Ser. No. 13/556,280); "SOLAR CELL AND SOLAR CELL SYSTEM", filed Jul. 19, 2012 (Ser. No. 13/552,750); "METHOD FOR MAKING SOLAR CELL", filed Aug. 8, 2012 (Ser. No. 13/569,274); and "METHOD FOR MAKING SOLAR CELL", filed Aug. 8, 2012 (Ser. No. 13/569,278).

BACKGROUND

1. Technical Field

The present disclosure relates to a solar cell, a solar cell system and a method for making the same.

2. Description of Related Art

An operating principle of a solar cell is the photoelectric effect of a semiconducting material. The solar cells can be roughly classified into silicon-based solar cells, gallium arsenide solar cells, and organic thin film solar cells.

A traditional silicon-based solar cell includes a rear electrode, a P-type silicon layer, an N-type silicon layer, and a front electrode. The P-type silicon layer can be made of polycrystalline silicon or monocrystalline silicon and has a first surface and a flat second surface opposite to the first surface. The rear electrode is located on and in ohmic contact with the first surface of the P-type silicon layer. The N-type silicon layer is formed on the second surface of the P-type silicon layer and serves as a photoelectric conversion element. The N-type silicon layer has a flat surface. The front electrode is located on the flat surface of the N-type silicon layer. The P-type silicon layer and the N-type silicon layer cooperatively form a P-N junction near an interface of the P-type silicon layer and the N-type silicon layer. In use, light directly irradiates the front electrode, and reaches the P-N junction through the front electrode and the N-type silicon layer. Consequently, a plurality of electron-hole pairs (carriers) can be generated in the P-N junction due to photon excitation. Electrons and holes in the electron-hole pairs can be separated from each other and separately move toward the rear electrode and the front electrode under an electrostatic potential. If a load is connected between the front electrode and the rear electrode, a current can flow through the load.

However, a light absorbing efficiency of the P-N junction of the above solar cell is low, because partial photons in the incident light are absorbed by the front electrode and the N-type silicon layer. Thus, carriers generated by exciting of photons in the P-N junction are relatively sparse, and a photoelectric conversion efficiency of the solar cell is relatively low.

What is needed, therefore, is to provide a solar cell having high photoelectric conversion efficiency and a method for making the same.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
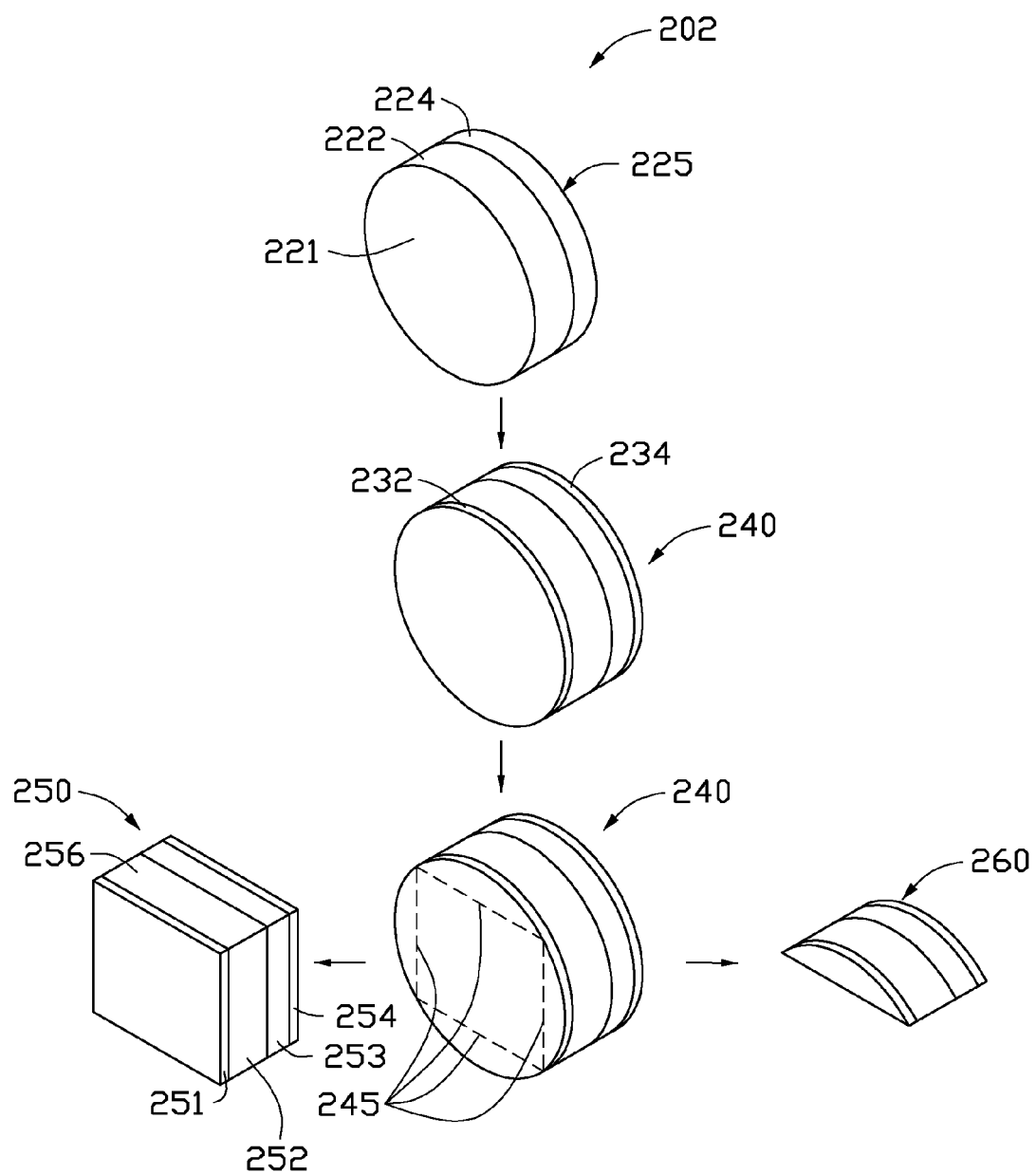
FIG. 1 is a flowchart of a method for making a solar cell of a first embodiment.

Referring to FIG. 1, a method for making a solar cell includes the following steps:

S11, providing a round P-N junction preform 202, wherein the P-N junction preform 202 includes a first silicon layer 222 and a second silicon layer 224 stacked on and in contact with the first silicon layer 222 a surface of the first silicon layer 222 which is away from the second silicon layer 224 is defined as a first surface 221, and a surface of the second silicon layer 224 which is away from the first silicon layer 222 is defined as a fourth surface 225;

S12, forming a first electrode preform 232 on the first surface 221 and forming a second electrode preform 234 on the fourth surface 225, wherein the first electrode preform 232, the first silicon layer 222, the second silicon layer 224, and the second electrode preform 234 are stacked on and in contact with each other to form a round solar cell preform 240; and S13, cutting the round solar cell preform 240 to obtain at least one rectangle solar cell 250 and at least one arc shaped solar cell 260.

In step S11, the first silicon layer 222 can be a P-type silicon layer or an N-type silicon layer. The second silicon layer 224 can be a P-type silicon layer or an N-type silicon layer. The type of the first silicon layer 222 and the type of the second silicon layer 224 are different. In one embodiment, the first silicon layer 222 is a P-type silicon layer and the second silicon layer 224 is an N-type silicon layer. The first silicon layer 222 and the second silicon layer 224 are round and have the same area.

The P-type silicon layer can be made of single crystal silicon or polycrystalline silicon. In one embodiment, the first silicon layer 222 is a P-type single crystal silicon layer. The thickness of the P-type single crystal silicon layer can be in a range from about 200 micrometers (μm) to about 300 μm. The area of the P-type single crystal silicon layer can be selected according to need. The second silicon layer 224 is N-type and can be fabricated by injecting N-type doping material such as phosphorus (P) or arsenic (As). The thickness of the second silicon layer 224 can be in a range from about 10 nanometers (nm) to about 1 μm.

Figure 2:
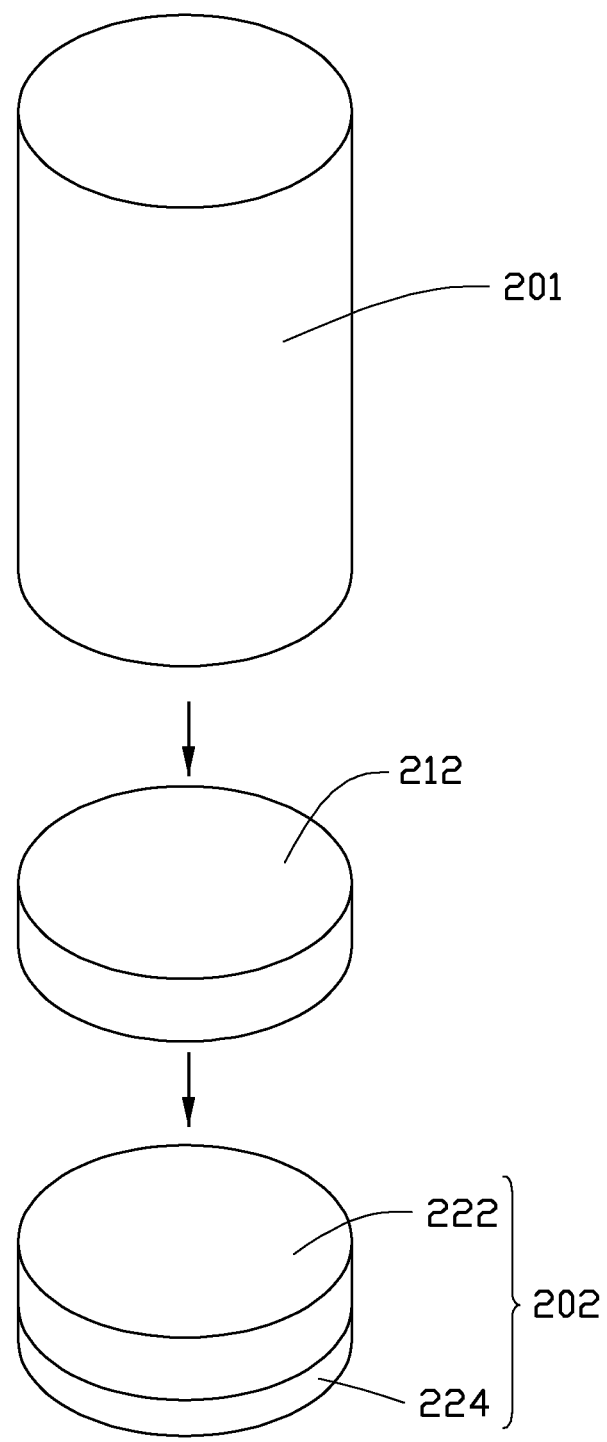
FIG. 2 is a flowchart of a method for making a P-N junction preform of the first embodiment.

Referring to FIG. 2, in one embodiment, the step of providing a round P-N junction preform 202 includes the following steps:

S111, providing a cylindrical silicon 201;

S112, cutting the cylindrical silicon 201 to obtain a plurality of round silicon wafers 212; and S113, doping the plurality of round silicon wafers 212 to form the P-N junction preform 202.

In step S111, the cylindrical silicon 201 can be the industrial silicon rod or silicon ingot. In one embodiment, the cylindrical silicon 201 is P-type.

In step S113, if the plurality of round silicon wafers 212 are non-doped, the plurality of round silicon wafers 212 need to be N-type and P-type doped. If the plurality of round silicon wafers 212 is P-type, it is only need to N-type dope the plurality of round silicon wafers 212.

In step S12, the first electrode preform 232 and the second electrode preform 234 can be a continuous planar shaped structure coated on an entirety of the first surface 221 and an entirety of the fourth surface 225. The material of the first electrode preform 232 and the second electrode preform 234 can be the same or different. The material of the first electrode preform 232 and the second electrode preform 234 can be conductive material, such as metal, conducting polymer, indium tin oxide, and carbon nanotube structure. The metal can be aluminum, copper, or silver. The thickness of first electrode preform 232 and the second electrode preform 234 is not limited, and can be in a range from about 50 nm to about 300 nm. In one embodiment, the first electrode preform 232 and the second electrode preform 234 are aluminum sheets having a thickness of 200 nm. The first electrode preform 232 and the second electrode preform 234 can be deposited by a process of vacuum evaporating or magnetron sputtering.

Figure 3:
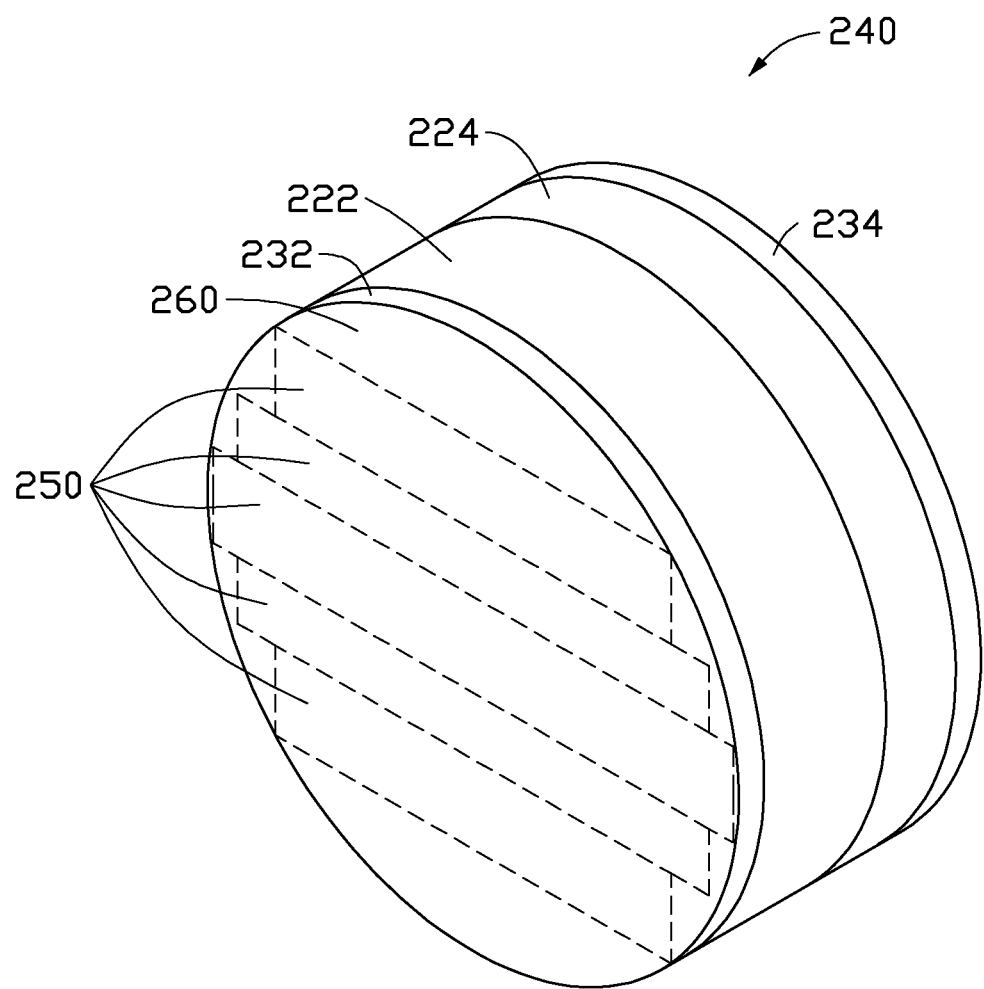
FIG. 3 is a method for cutting a solar cell preform of the first embodiment.
Figure 7:
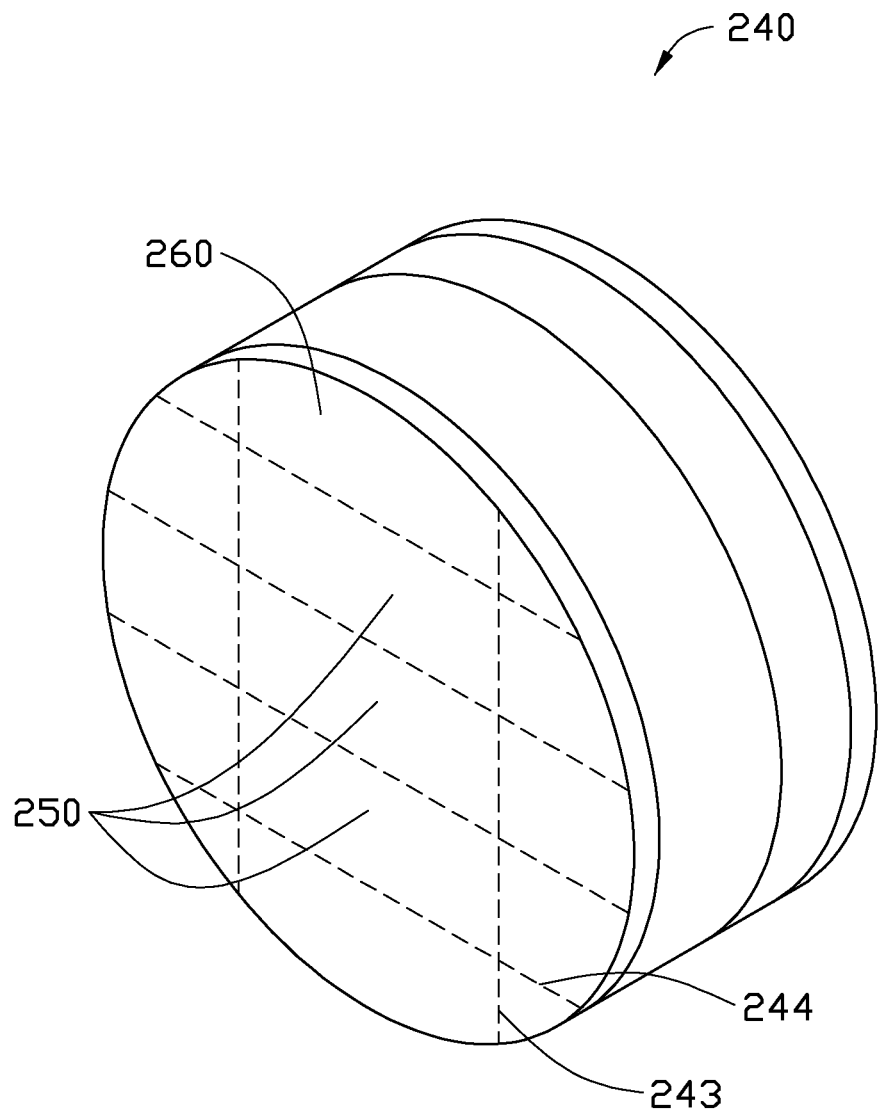
FIG. 7 is another method for cutting a solar cell preform of the first embodiment.

In step S13, the at least one arc shaped solar cell 260 defines at least one arc shaped surface. The method of cutting the round solar cell preform 240 can be selected according to need. In one embodiment, the round solar cell preform 240 is cut into one of the at least one rectangular solar cell 250 and four of the least one arc shaped solar cells 260 along four cutting lines 245 as shown in FIG. 1, where the at least one rectangular solar cell 250 has a diagonal equal to the diameter of the round solar cell preform 240. In one embodiment, the round solar cell preform 240 is cut into five of the at least one rectangle solar cells 250 and several of the at least one arc shaped solar cells 260 as shown in FIG. 3. In one embodiment, the round solar cell preform 240 is cut into three of the at least one rectangle solar cells 250 that are substantially the same and several of the at least one arc shaped solar cells 260 as shown in FIG. 7. Also, the round solar cell preform 240 can be used as a solar cell with the round side surface as photoreceptive surface.

The at least one rectangular solar cell 250 includes a first electrode layer 251, a P-type silicon layer 252, an N-type silicon layer 253, and a second electrode layer 254 stacked on each other in that order and electrically connected in series. The P-type silicon layer 252 and the N-type silicon layer 253 are electrically connected with and contacting each other to form a P-N junction. In one embodiment, the at least one rectangular solar cell 250 can be used as a traditional silicon-based solar cell in which the light directly irradiates the at least one rectangular solar cell 250 from the first electrode layer 251 or the second electrode layer 254. In one embodiment, the at least one rectangular solar cell 250 can be used as one type of solar cell in which the light directly irradiates the P-N junction from a side surface 256 of the at least one rectangular solar cell 250.

Figure 4:
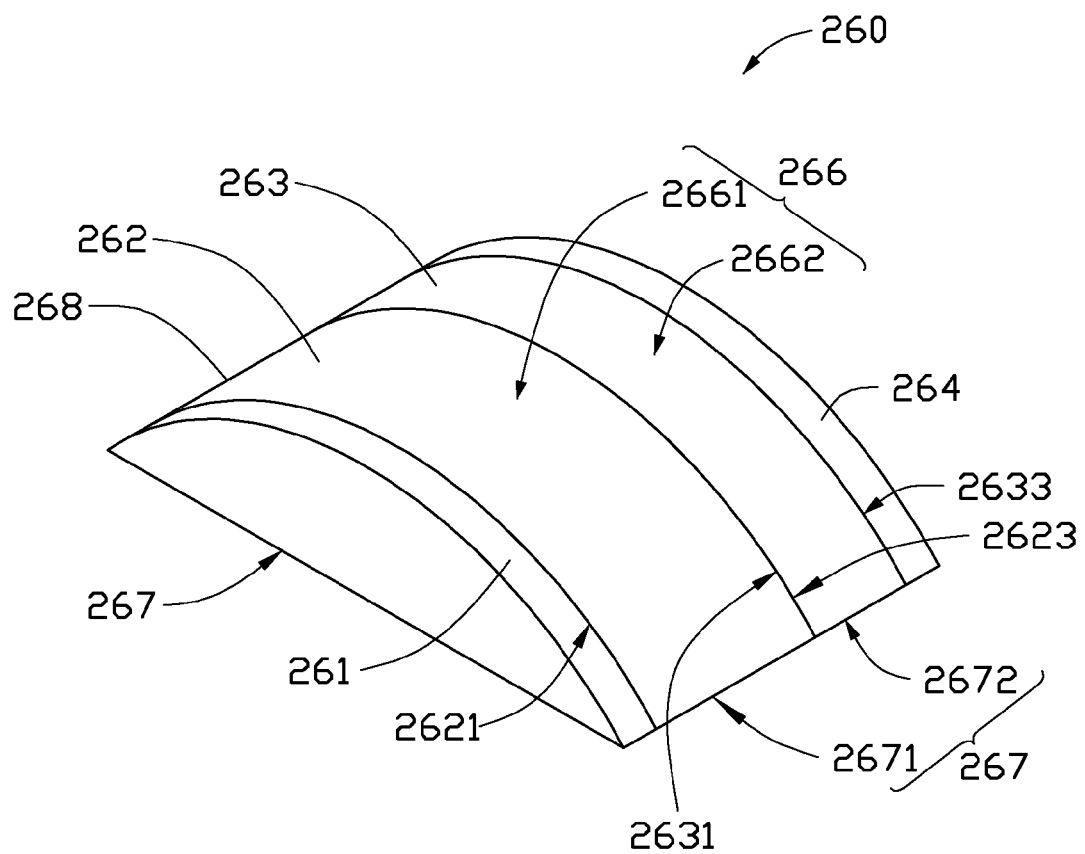
FIG. 4 is a schematic view of an arc shaped solar cell provided by the cutting method of FIG. 1.

Referring to FIG. 4, the at least one arc shaped solar cell 260 of one embodiment includes a first electrode layer 261, a P-type silicon layer 262, an N-type silicon layer 263, and a second electrode layer 264. The first electrode layer 261, the P-type silicon layer 262, the N-type silicon layer 263, and the second electrode layer 264 can be arranged in series along the same direction, side by side, in that order, cooperatively forming an integrated structure.

In particular, the P-type silicon layer 262 has an arc shaped first top surface 2661, a planar first bottom surface 2671 opposite to and connecting to the arc shaped first top surface 2661, a first side surface 2621 and a second side surface 2623 opposite to the first side surface 2621. The N-type silicon layer 263 has an arc shaped second top surface 2662, a planar second bottom surface 2672 opposite to and connecting to the arc shaped second top surface 2662, a third side surface 2631 and a fourth side surface 2633 opposite to the third side surface 2631. The first electrode layer 261 is electrically connected with and contacting the first side surface 2621 of the P-type silicon layer 262. The second electrode layer 264 is electrically connected with and contacting the fourth side surface 2633 of the N-type silicon layer 263. The second side surface 2623 of the P-type silicon layer 262 and the third side surface 2631 of the N-type silicon layer 263 are electrically connected with and contacting each other to form a P-N junction. The arc shaped first top surface 2661 and the arc shaped second top surface 2662 commonly form an arc shaped photoreceptive surface 266 to receive an incident light. The planar first bottom surface 2671 and the planar second bottom surface 2672 are coplanar to form a planar supporting surface 267 to mount the at least one arc shaped solar cell 260. The arc shaped photoreceptive surface 266 and the planar supporting surface 267 connect to each other at line 268. The P-N junction is exposed out from the arc shaped photoreceptive surface 266. The at least one arc shaped solar cell 260 has a larger surface to receive an incident light because the arc shaped photoreceptive surface 266 is arc shaped. The arc shaped photoreceptive surface 266 can reduce the reflection of the incident light from different directions.

An inner electric field having a field direction from the N-type silicon layer 263 to the P-type silicon layer 262 is formed, because surplus electrons in the N-type silicon layer 263 diffuse across the P-N junction and reach the P-type silicon layer 262. When a plurality of electron-hole pairs are generated in the P-N junction due to excitation of an incident light, the electrons and the holes are separated from each other under the inner electric field. Specifically, the electrons in the N-type silicon layer 263 move toward the second electrode layer 264, and are gathered by the second electrode layer 264. The holes in the P-type silicon layer 262 move toward the first electrode layer 261, and are gathered by the first electrode layer 261. Thus, a current is formed, thereby realizing a conversion from the light energy to the electrical energy.

In use, the incident light does not reach the P-N junction through the first electrode layer 261, namely, the first electrode layer 261 will not obstruct the incident light to reach the P-N junction. Thus, the first electrode layer 261 can be a continuous planar shaped structure coated on an entirety of the first side surface 2621 of the P-type silicon layer 262, or a lattice shaped structure partially coated on the on the first side surface 2621. A material of the first electrode layer 261 is conductive material, such as metal, conducting polymer, indium tin oxide, and carbon nanotube structure. In one embodiment, the first electrode layer 261 is made of a metal layer having a continuous planar shaped structure and coated on the entirety of the first side surface 2621. The metal can be aluminum, copper, or silver. A thickness of the first electrode layer 261 is not limited, and can be in a range from about 50 nm to about 300 nm. In one embodiment, the first electrode layer 261 is an aluminum sheet having a thickness of about 200 nm.

Furthermore, the incident light does not reach the P-N junction through the second electrode layer 264. Thus, the second electrode layer 264 can be a continuous planar shaped structure coated on an entirety of the fourth side surface 2633 of the N-type silicon layer 263, or a lattice shaped structure partially coated on the fourth side surface 2633. A material of the second electrode layer 264 can be conductive material, such as metal, conducting polymer, indium tin oxide, and carbon nanotube structure. In one embodiment, the second electrode layer 264 is made of a metal layer having a continuous planar shaped structure and coated on the entirety of the fourth side surface 2633. The metal can be aluminum, copper, or silver. A thickness of the second electrode layer 264 is not limited, and can be in a range from about 50 nm to about 300 nm. In one embodiment, the second electrode layer 264 is an aluminum sheet having a thickness of 200 nm.

In addition, the material of the first electrode layer 261 and the second electrode layer 264 can be opaque to avoid leakage of the incident light passing through the first electrode layer 261 and the second electrode layer 264, thus the photoelectric conversion efficiency of the at least one arc shaped solar cell 260 is improved.

When the incident light irradiates the arc shaped photoreceptive surface 266 of the at least one arc shaped solar cell 260, since the P-N junction is directly exposed from the arc shaped photoreceptive surface 266, the photons in the incident light directly reach the P-N junction without passing through the second electrode layer 264 and the first electrode layer 261, and can be directly absorbed by the P-N junction. Accordingly, the second electrode layer 264 and the first electrode layer 261 cannot obstruct the incident light to reach the P-N junction, thereby increasing the light absorbing efficiency of the P-N junction. Correspondingly, the P-N junction can excite more electron-hole pairs under the irradiation of the incident light. In addition, the second electrode layer 264 can have any shape and cannot obstruct light. In one embodiment, the second electrode layer 264 having a planar shaped structure is coated on the entirety of the fourth side surface 2633. Thus, the second electrode layer 264 has a large area, thereby decreasing the diffusing distance of the carriers in the second electrode layer 264 and the interior loss of the carriers, and increasing the photoelectric conversion efficiency of the at least one arc shaped solar cell 260.

Figure 5:
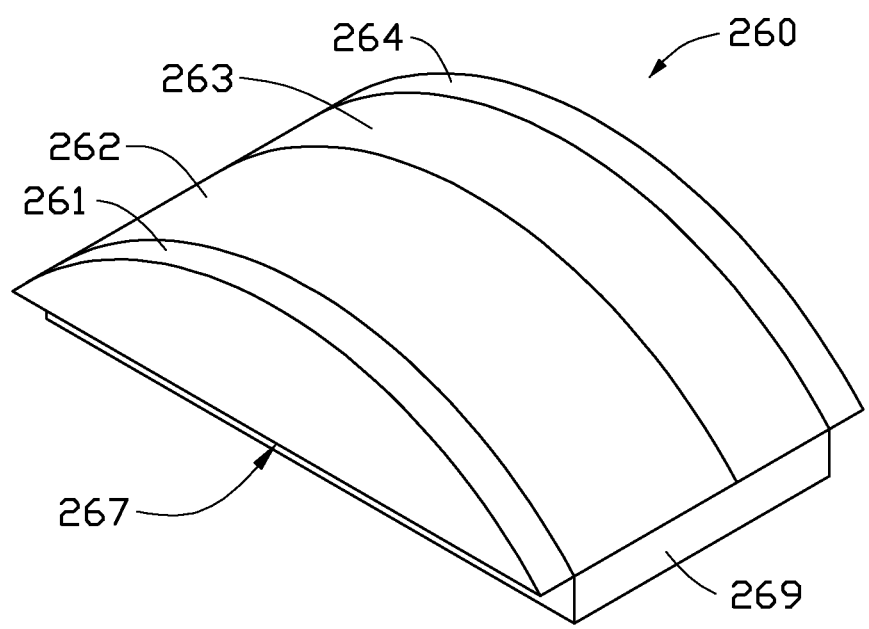
FIG. 5 is a schematic view of an improvement of the arc shaped solar cell of FIG. 4.

Referring to FIG. 5, a step S14 of forming a reflector 269 on the planar supporting surface 267 can be performed. The reflector 269 is located on the planar supporting surface 267 and insulated from the first electrode layer 261 and the second electrode layer 264.

In one embodiment, the reflector 269 can be a continuous reflection layer directly in contact with the planar supporting surface 267 and spaced from the first electrode layer 261 and the second electrode layer 264. The reflector 269 can be made of metal such as aluminum, gold, copper or silver. The thickness of the reflector 269 can be in a range from about 10 nm to about 100 µm. In one embodiment, the reflector 269 is aluminum foil with a thickness of about 50 nm. The reflector 269 can be formed on the planar supporting surface 267 by vacuum evaporation or magnetron sputtering.

Furthermore, the reflector 269 can be spaced from the planar supporting surface 267 by a transparent insulating layer (not shown). The transparent insulating layer is located on the covers an entirety of the planar supporting surface 267. The reflector 269 is continuous reflection layer located on and covers the entire transparent insulating layer. The transparent insulating layer is made of material with a certain chemical stability, such as diamond-like carbon, silicon, silicon carbide, silicon dioxide, silicon nitride, aluminum oxide or boron nitride. The thickness of the transparent insulating layer can be in a range from about 10 nm to about 100 µm. In one embodiment, the thickness of the transparent insulating layer can be in a range from about 10 nm to about 50 nm in order to reduce the light absorption. The transparent insulating layer can be coated on the planar supporting surface 267 by physical vapor deposition or chemical vapor deposition. The reflector 269 can be formed on the transparent insulating layer by vacuum evaporation or magnetron sputtering.

In one embodiment, the reflector 269 can be free standing, suspended and spaced from the planar supporting surface 267. The distance between the reflector 269 and the planar supporting surface 267 can be in a range from about 1 millimeters (mm) to about 5 centimeters (cm). If the reflector 269 is not free standing, a plate (not shown) can be used to support the reflector 269. The term "free standing" means that the reflector can sustain the weight of itself when it is hoisted by a portion thereof without any significant damage to its structural integrity. The plate can be a glass plate, ceramic plate or silicon plate. The reflector 269 can be formed on the plate by vacuum evaporation or magnetron sputtering.

In one embodiment, the reflector 269 is a plurality of micro-structures. Each of the plurality of micro-structures can be a concave groove on the planar supporting surface 267 or a protrusion protruding from the planar supporting surface 267. Each of the plurality of micro-structures can be V shaped, cylindrical, hemispherical, or pyramid-shaped. The micro-structures can be formed by etching the planar supporting surface 267. Furthermore, the micro-structures can be coated with a reflecting material such as aluminum, gold, copper or silver by vacuum evaporation or magnetron sputtering.

Furthermore, a step S15 of forming an antireflection layer (not shown) on the arc shaped photoreceptive surface 266 can be performed. The antireflection layer is used to decrease reflection of the incident light and increase absorption of the incident light. The antireflection layer can absorb little light. A material of the antireflection layer can be silicon nitride ($Si_3N_4$) or silicon dioxide ($SiO_2$). A thickness of the antireflection layer can be less than 150 nm. In one embodiment, the antireflection layer is the silicon nitride layer having the thickness of 900 angstrom (Å).

Figure 6:
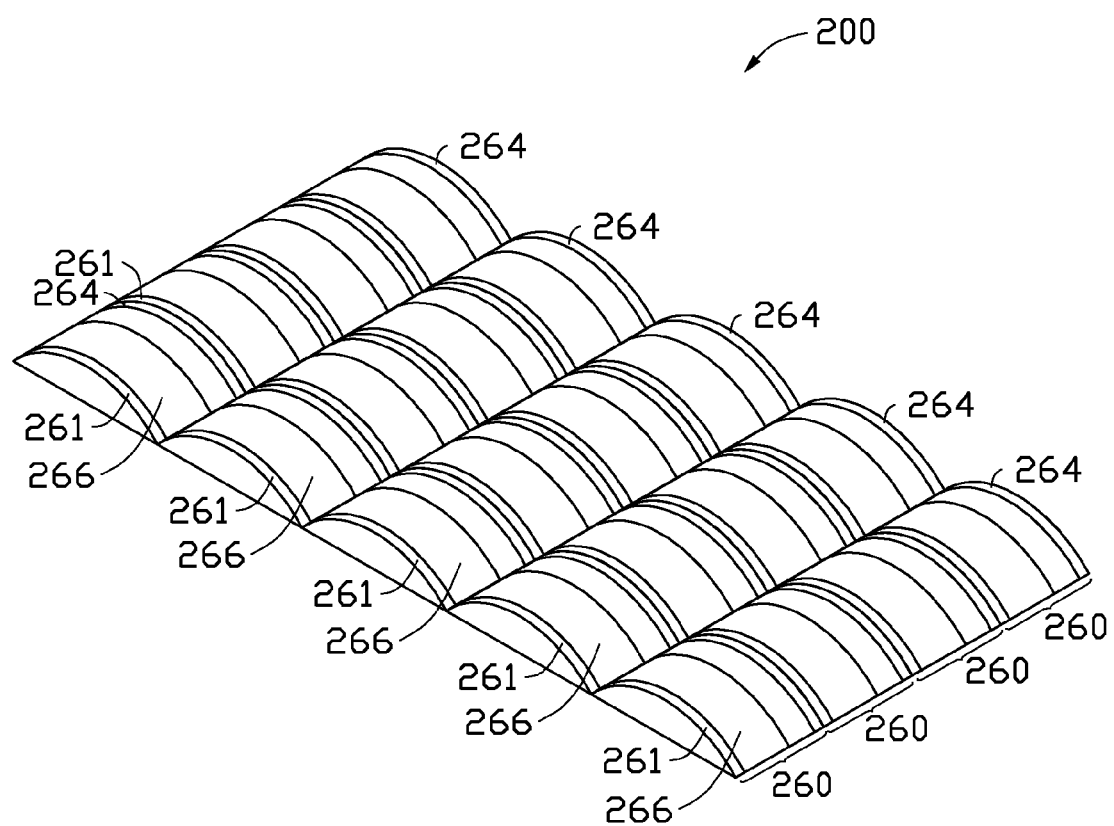
FIG. 6 is a schematic view of the solar cell system using the arc shaped solar cell of FIG. 4.

Referring to FIG. 6, a step S16 of assembling a plurality of arc shaped solar cells 260 to form a solar cell system 200 can be performed. The plurality of arc shaped solar cells 260 can be stacked side by side in a column and electrically connected to each other in series. Each of the first electrode layer 261 is in contact with the second electrode layer 264 of adjacent one of the plurality of arc shaped solar cells 260. Also, the plurality of arc shaped solar cells 260 can be located one by one in a row and electrically connected to each other in parallel. In one embodiment, the plurality of arc shaped solar cells 260 is arranged along a column first and then along a row to form a solar cells array. The arc shaped photoreceptive surfaces 266 and the planar supporting surfaces 267 of the plurality of arc shaped solar cells 260 in each column form a common photoreceptive surface. The arc shaped photoreceptive surfaces of the plurality of solar cells 260 in each row form a wavy photoreceptive surface. Furthermore, a common transparent insulating layer (not shown) can be located on and covering an entirety of the planar supporting surface 267 and a common reflector can be located on the common transparent insulating layer. Furthermore, an antireflection layer (not shown) having a thickness of about 150 nm can be coated on the common photoreceptive surface.

Figure 8:
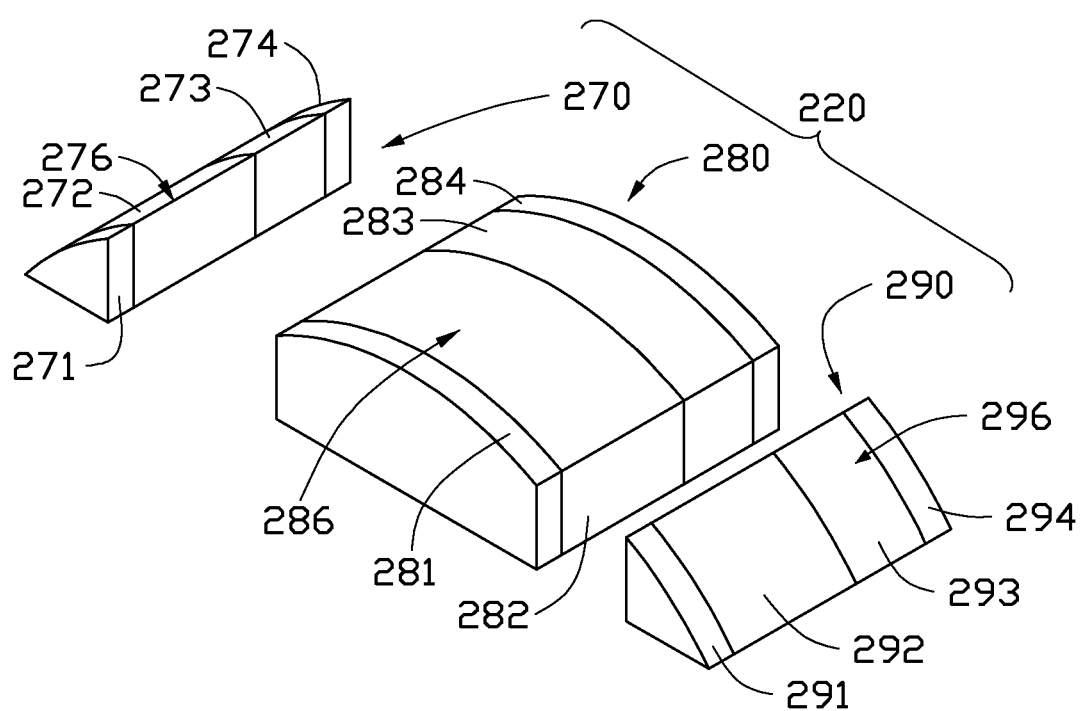
FIG. 8 is a schematic view of the arc shaped solar cells provided by the cutting method of FIG. 7.

Referring to FIG. 8, a solar cell system 220 of one embodiment includes a first solar cell 270, a second solar cell 280, and a third solar cell 290. The first solar cell 270, the second solar cell 280, and the third solar cell 290 are formed by cutting the round solar cell preform 240 along vertical cutting lines 243 and horizontal cutting lines 244 as shown in FIG. 7. In this embodiment, the plurality of arc shaped solar cells 260 of FIG. 7 are cut into the first solar cell 270, the second solar cell 280, and the third solar cell 290. The first solar cell 270, the second solar cell 280, and the third solar cell 290 are located in contact with each other and electrically connected to each other in parallel.

The first solar cell 270 includes a first electrode layer 271, a P-type silicon layer 272, an N-type silicon layer 273, and a second electrode layer 274. The second solar cell 280 includes a first electrode layer 281, a P-type silicon layer 282, an N-type silicon layer 283, and a second electrode layer 284. The third solar cell 290 includes a first electrode layer 291, a P-type silicon layer 292, an N-type silicon layer 293, and a second electrode layer 294. The first solar cell 270 has an arc shaped photoreceptive surface 276 to receive an incident light. The second solar cell 280 has an arc shaped photoreceptive surface 286 to receive an incident light. The third solar cell 290 has an arc shaped photoreceptive surface 296 to receive an incident light. When the first solar cell 270, the second solar cell 280, and the third solar cell 290 are assembled to form the solar cell system 220, the arc shaped photoreceptive surface 276, the arc shaped photoreceptive surface 286 and the arc shaped photoreceptive surface 296 are connected to form a continuous arc shaped photoreceptive surface. The first electrode layers 271, 281 and 291 are in contact and electrically connected to each other. The first electrode layers 271, 281 and 291 are in contact and electrically connected to each other. The P-type silicon layers 272, 282 and 292 are electrically connected to each other in parallel. The N-type silicon layers 273, 283 and 293 are electrically connected to each other in parallel.

Figure 9:
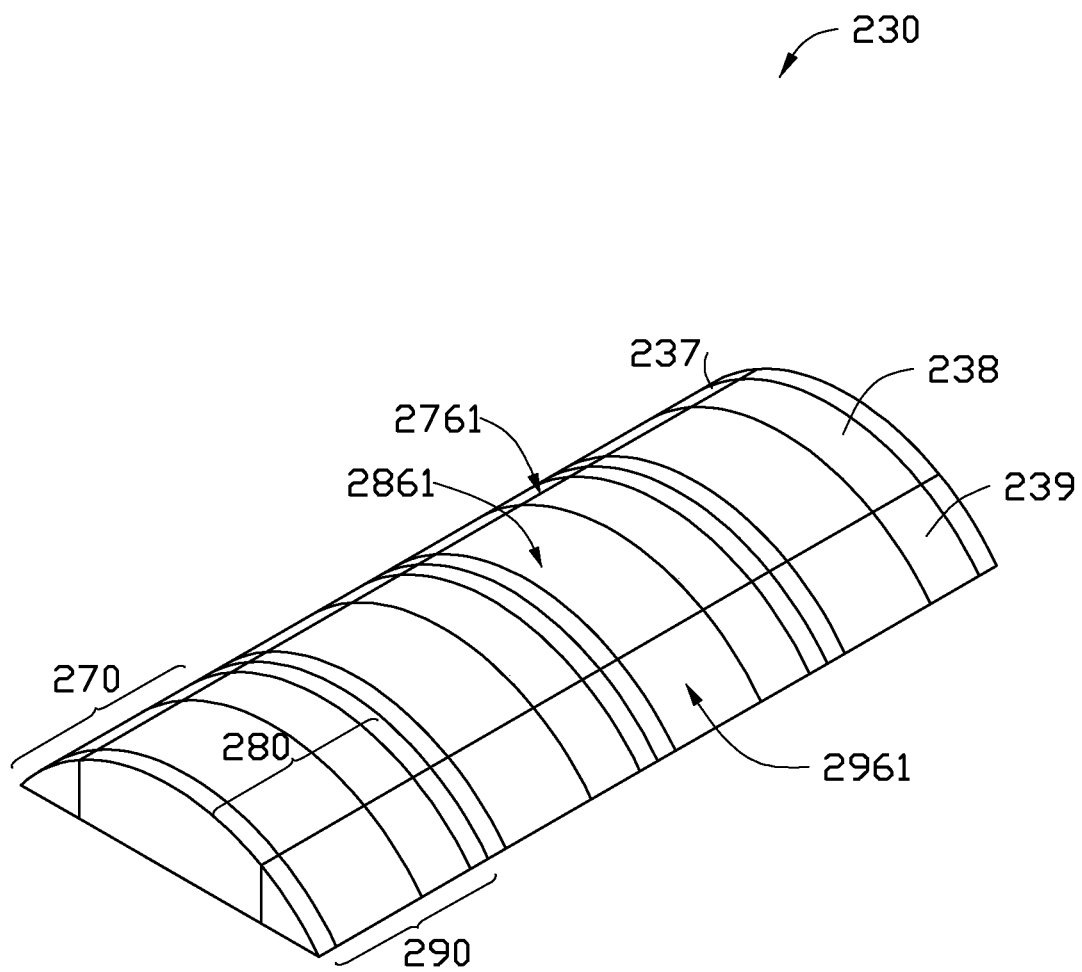
FIG. 9 is a schematic view of the solar cell system using the arc shaped solar cells of FIG. 8.

Referring to FIG. 9, in one embodiment, a solar cell system 230 includes a first solar cell system unit 237, a second solar cell system unit 238, and a third solar cell system unit 239. The first solar cell system unit 237 includes a plurality of first solar cells 270 located side by side along the same direction, in contact with and electrically connected to each other in series. The first solar cell system unit 237 has an arc shaped photoreceptive surface 2761. The second solar cell system unit 238 includes a plurality of second solar cells 280 located side by side along the same direction, in contact with and electrically connected to each other in series. The second solar cell system unit 238 has an arc shaped photoreceptive surface 2861. The third solar cell system unit 239 includes a plurality of third solar cells 290 located side by side along the same direction, in contact with and electrically connected to each other in series. The third solar cell system unit 239 has an arc shaped photoreceptive surface 2961. When the first solar cell system unit 237, the second solar cell system unit 238, and the third solar cell system unit 239 are assembled to form the solar cell system 230, the arc shaped photoreceptive surface 2761, the arc shaped photoreceptive surface 2861 and the arc shaped photoreceptive surface 2961 are connected to form a continuous arc shaped photoreceptive surface. The first solar cell system unit 237, the second solar cell system unit 238, and the third solar cell system unit 239 are in contact with and electrically connected to each other in parallel.

Figure 10:
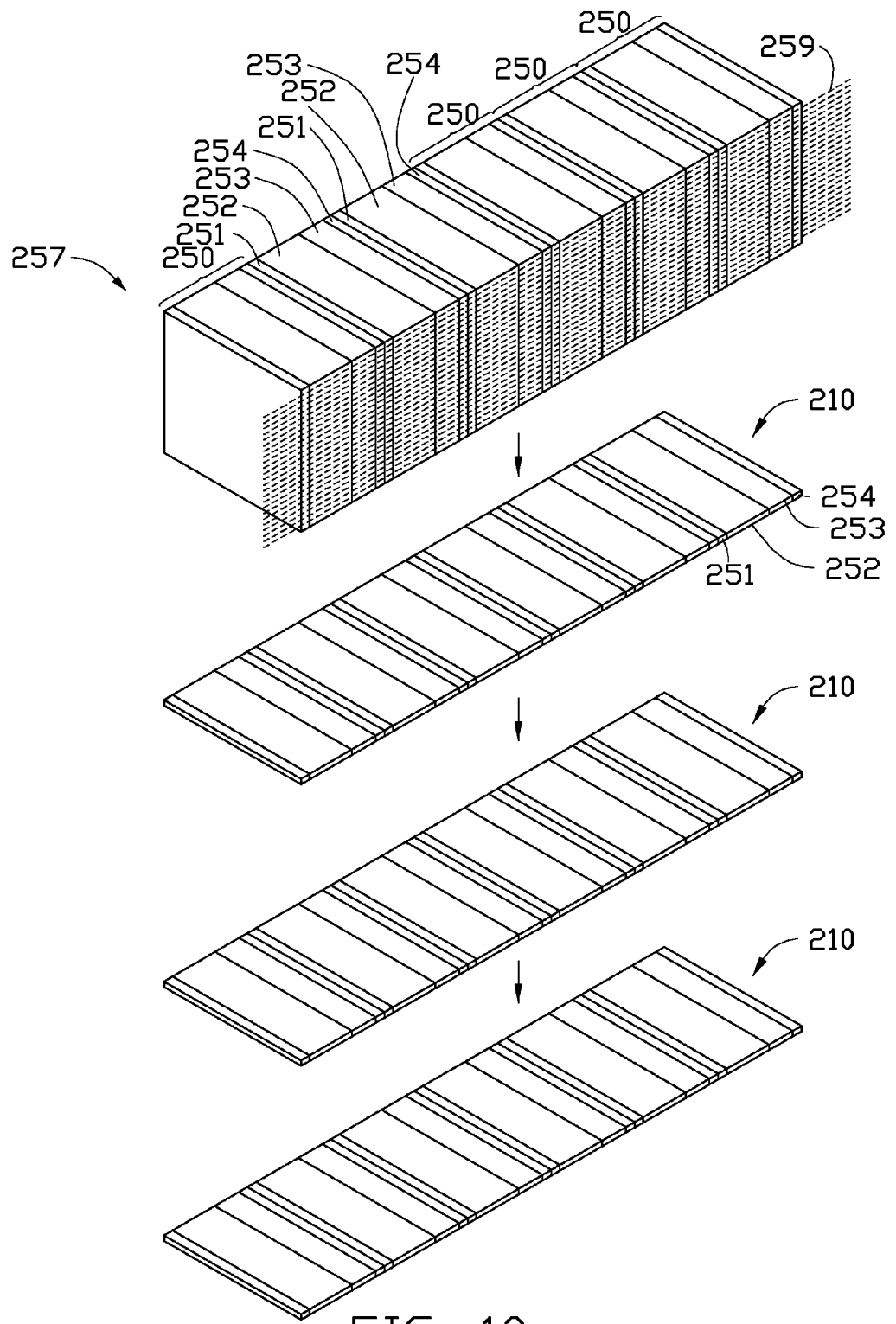
FIG. 10 is a flowchart of a method for making the solar cell using rectangle solar cell of FIG. 1.

Referring to FIG. 10, in one embodiment, a step S17 of stacking a plurality of rectangular solar cells 250 to form a preform 257 and a step S18 of cutting the preform 257 to form a plurality of solar cells 210 can be performed. In step S17, the plurality of rectangular solar cells 250 is stacked and in contact with each other along the first direction. The first electrode layer 251 of each of the plurality of rectangular solar cells 250 is in contact with the second electrode layer 254 of adjacent one of the plurality of rectangular solar cells 250. In step S18, the preform 257 is cut along a plurality of cutting lines 259 to form the plurality of solar cells 210. Each of the plurality of solar cells 210 is laminal as shown in FIG. 10. The cutting line 259 is parallel to the stacking direction.

Figure 11:
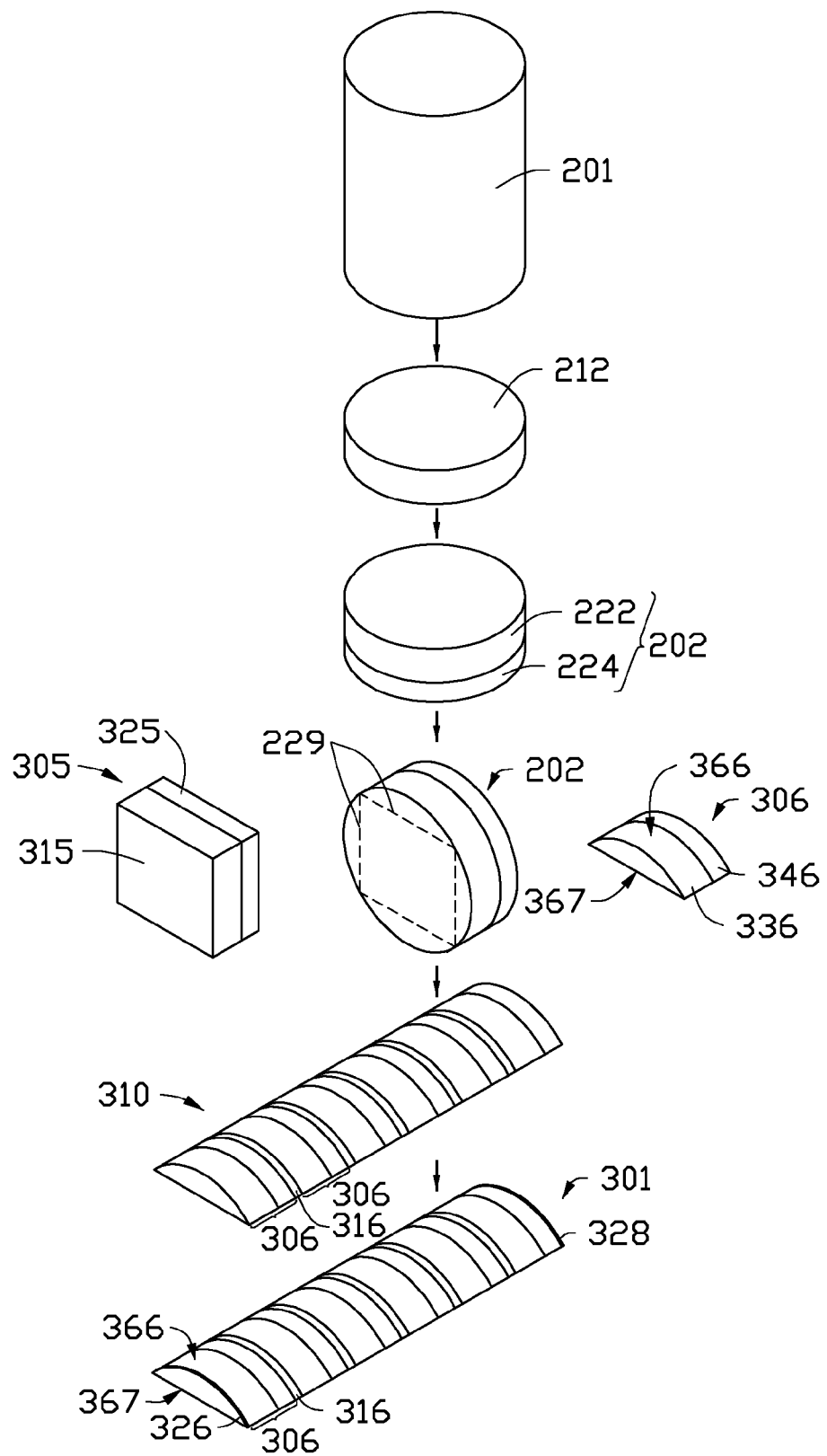
FIG. 11 is a flowchart of a method for making a solar cell system of a second embodiment.

Referring to FIG. 11, a method for making a solar cell system includes the following steps:

S31, providing a cylindrical silicon 201;

S32, cutting the cylindrical silicon 201 to obtain a plurality of round silicon wafers 212;

S33, doping the plurality of round silicon wafers 212 to form a plurality of P-N junction preforms 202, wherein each of the plurality of P-N junction preforms 202 includes a first silicon layer 222 and a second silicon layer 224 stacked on and in contact with the first silicon layer 222;

S34, cutting each of the plurality of P-N junction preforms 202 to obtain a square P-N junction unit 305 and four arc shaped P-N junction units 306 along cutting lines 229, wherein each of the four arc shaped P-N junction units 306 has an arc shaped top surface 366 and a planar bottom surface 367;

S35, stacking the four arc shaped P-N junction units 306 along the same direction and forming an electrode layer 316 between each adjacent two of the four arc shaped P-N junction units 306 to form a solar cell system preform 310; and S36, forming a first collection electrode 326 on a first of the four arc shaped P-N junction units 306 and a second collection electrode 328 on a last of the four arc shaped P-N junction units 306 to form a solar cell system 301.

Steps S31, S32, and S33 are the same as the steps S111, S112, and S113.

In step S34, the method of cutting each of the plurality of P-N junction preforms 202 can be selected according to need. The square P-N junction unit 305 includes a P-type silicon layer 315 and an N-type silicon layer 325. Each of the four arc shaped P-N junction units 306 includes a P-type silicon layer 336 and an N-type silicon layer 346.

In step S35, the electrode layer 316 can be conductive material, such as metal, conducting polymer, indium tin oxide, and carbon nanotube structure. In one embodiment, the electrode layer 316 is made of a metal layer having a continuous planar shaped. The metal can be aluminum, copper, or silver. The four arc shaped P-N junction units 306 are electrically connected through the electrode layer 316. The planar bottom surfaces 367 of the four arc shaped P-N junctions are coplanar to form a supporting surface. The arc shaped top surfaces 366 of the four arc shaped P-N junctions form an arc shaped photoreceptive surface to receive an incident light.

Figure 12:
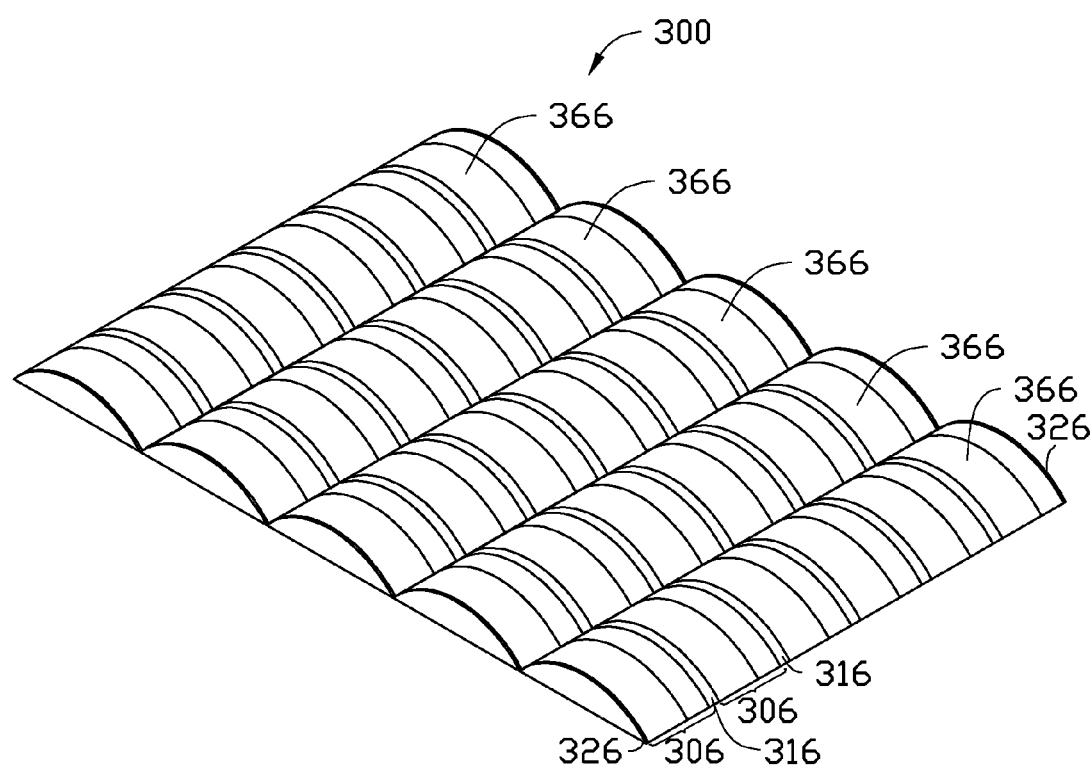
FIG. 12 is a schematic view of the solar cell system provided by the second embodiment.

Referring to FIG. 12, a step S37 of assembling a plurality of solar cell systems 301 to form a solar cell system 300 can be further performed. The plurality of solar cell systems 301 is electrically connected in parallel. The solar cell system 300 has a wavy photoreceptive surface to receive an incident light.

In the process of making traditional silicon-based solar cell, the square P-N junction unit 305 is used to make the solar cell and the four arc shaped P-N junction units 306 are usually useless and will be wasted. However, in the disclosure, the four arc shaped P-N junction units 306 are used to make solar cell system. Thus, remaining of the four arc shaped P-N junction units 306 would be reused to make a solar cell system with high photoelectric conversion efficiency.

Figure 13:
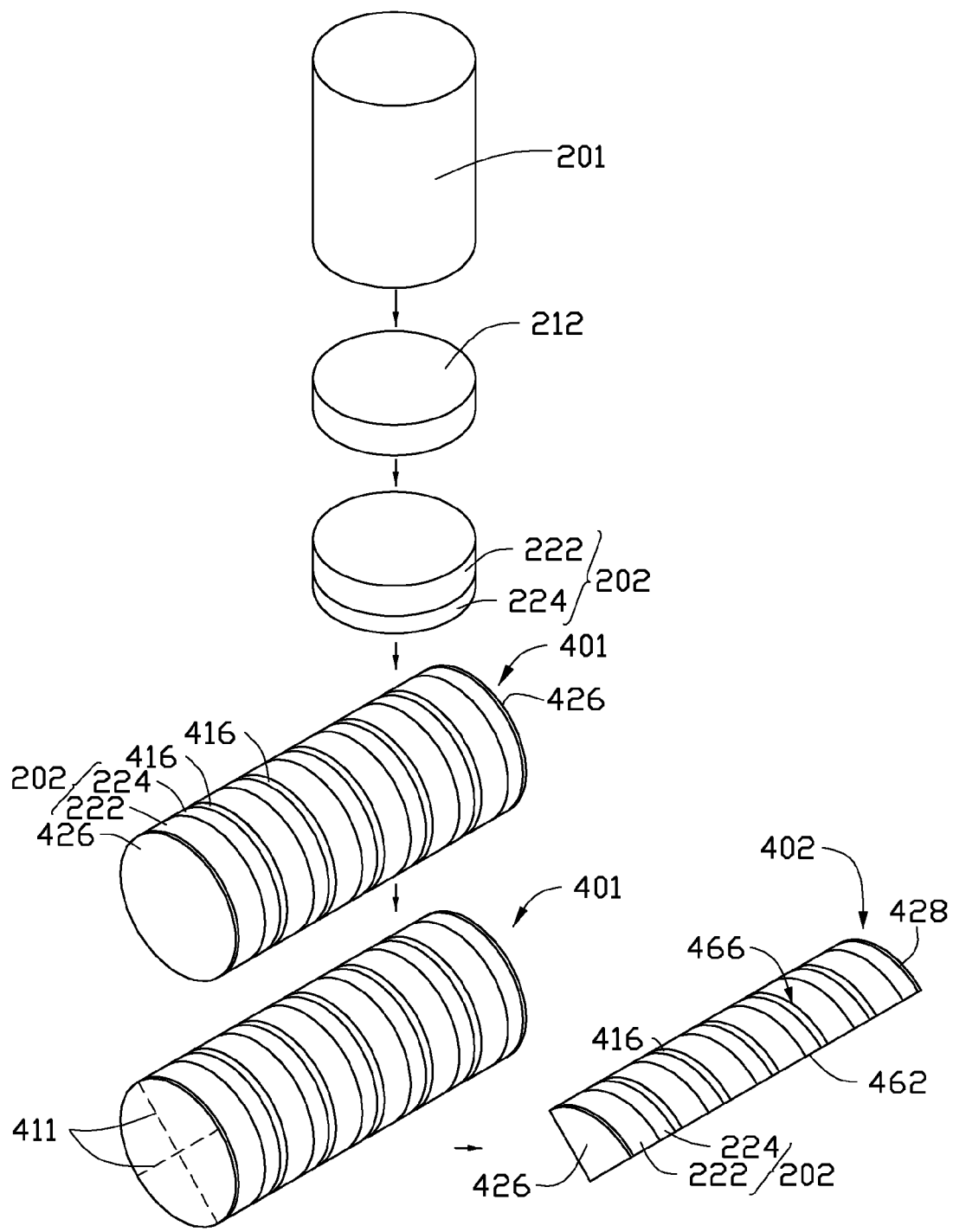
FIG. 13 is a flow chart of a method for making a solar cell system of a third embodiment.

Referring to FIG. 13, a method for making a solar cell system includes the following steps:

S41, providing a cylindrical silicon 201;

S42, cutting the cylindrical silicon 201 to obtain a plurality of round silicon wafers 212;

S43, doping the plurality of round silicon wafers 212 to form a plurality of P-N junction preforms 202, wherein each of the plurality of P-N junction preforms 202 includes a first silicon layer 222 and a second silicon layer 224 stacked on and in contact with the first silicon layer 222; and S44, stacking the plurality of P-N junction preforms 202 along the same direction, forming an electrode layer 416 between adjacent two of the plurality of P-N junction preforms 202, forming a first collection electrode 426 on a first of the plurality of P-N junction preforms 202, and forming a second collection electrode 428 on a last of the plurality of P-N junction preforms 202 to form a cylindrical solar cell system 401, wherein the plurality of P-N junction preforms 202 is electrically connected through the electrode layer 416.

Steps S41, S42, and S43 are the same as the steps S111, S112, and S113. The cylindrical solar cell system 401 has a cylindrical photoreceptive surface to receive an incident light from different directions.

Furthermore, a step S45 of cutting the cylindrical solar cell system 401 along cutting lines 411 to obtain at least one sectorial solar cell system 402 can be performed. The cylindrical solar cell system 401 is cut along at least one diameter thereof. In one embodiment, the cylindrical solar cell system 401 is cut along two perpendicular diameters to obtain four of the at least one sectorial solar cell systems 402 as shown in FIG. 13. Each of the at least one sectorial solar cell system 402 has an arc shaped photoreceptive surface 466 to receive an incident light and two planar surfaces 462 connecting to the arc shaped photoreceptive surface 466 and perpendicular to each other. Also a reflector can be formed on each of the two planar surfaces 462 to improve the photoelectric conversion efficiency.

Figure 14:
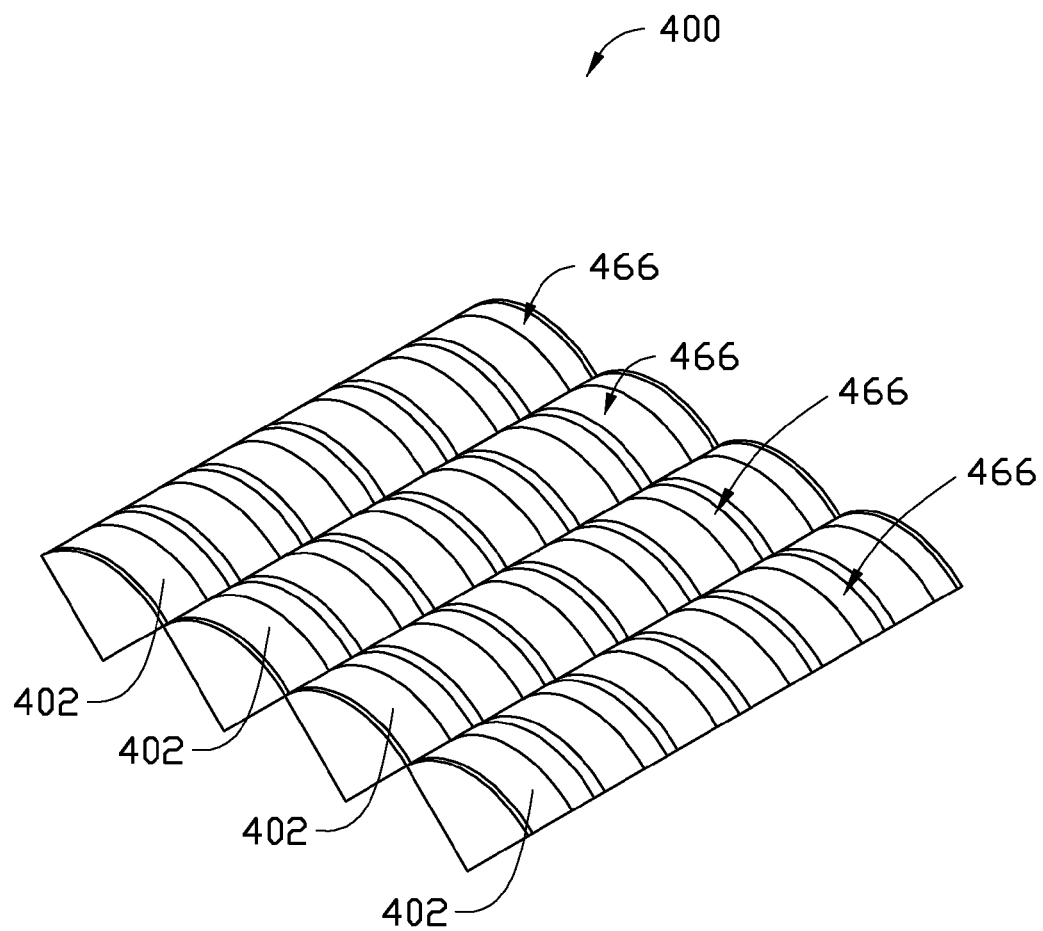
FIG. 14 is a schematic view of the solar cell system provided by the third embodiment.

Furthermore, a step S46 of assembling a plurality of sectorial solar cell systems 402 to obtain a solar cell system 400 can be performed as shown in FIG. 14. In one embodiment, four of the plurality of sectorial solar cell systems 402 are assembled and electrically connected in parallel to form the solar cell system 400. The solar cell system 400 has a wavy photoreceptive surface to receive an incident light.

Depending on the embodiment, certain steps of methods described may be removed, others may be added, and the sequence of steps may be altered. It is also to be understood, that the description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A solar cell making method, comprising steps of:

S11, making a round P-N junction preform by (a) stacking a P-type silicon layer and a N-type silicon layer on top of each other, and (b) forming a P-N junction near an interface between the P-type silicon layer and the N-type silicon layer, wherein a surface of the P-type silicon layer away from the N-type silicon layer is defined as a first surface, and a surface of the N-type silicon layer away from the P-type silicon layer is defined as a second surface;

S12, forming a first electrode preform on the first surface and forming a second electrode preform on the second surface, thereby forming a round solar cell perform comprising the first electrode preform, the P-type silicon layer, the N-type silicon layer, and the second electrode preform arranged in the above sequence; and S13, forming a photoreceptive surface with the P-N junction exposed on the photoreceptive surface by cutting the round solar cell preform into a plurality of arc shaped solar cells, the photoreceptive surface being on a curved surface of the arc shaped solar cell and being configured to receive incident light beams.

2. The solar cell making method of claim 1, wherein the arc shaped solar cell defines an arc shaped side surface and a planar side surface, each of the arc shaped side surface and the planar side surface is connected with each of the first surface and the second surface, and the photoreceptive surface is defined by the arc shaped side surface.

3. The solar cell making method of claim 2, further comprising a step S14 of forming a reflector on the planar side surface.

4. The solar cell making method of claim 3, wherein the reflector is made of metal and forming of the reflector is carried out by vacuum evaporation or by magnetron sputtering.

5. The solar cell making method of claim 3, forming of the reflector is carried out by etching the planar side surface into a plurality of micro-structures.

6. The solar cell making method of claim 2, further comprising a step of forming an antireflection layer on the arc shaped side surface.

7. The solar cell making method of claim 6, wherein the antireflection layer is made of silicon nitride or silicon dioxide and forming of the antireflection layer is carried out by vacuum evaporation or by magnetron sputtering.

8. The solar cell making method of claim 1, further comprising a step of assembling the plurality of arc shaped solar cells into a solar cell system.

9. The solar cell making method of claim 8, the assembling comprises stacking the plurality of arc shaped solar cells side by side into a column and electrically connecting the plurality of arc shaped solar cells in series.

10. The solar cell making method of claim 8, the assembling further comprises placing the plurality of solar cells in a row and electrically connecting the plurality of solar cells in parallel.

11. The solar cell making method of claim 1, cutting of the round solar cell preform comprises cutting along at least one vertical cutting line and cutting along at least one horizontal cutting line.

12. The solar cell making method of claim 1, wherein cutting of the round solar cell perform comprises cutting the round solar cell preform into a square solar cell and four arc shaped solar cells, a diagonal length of the square solar cell being equal to a diameter of the round solar cell preform.

13. The solar cell making method of claim 1, wherein step S11 comprises substeps of:
  S111, providing a cylindrical silicon;
  S112, cutting the cylindrical silicon into a plurality of round silicon wafers; and
  S113, forming a plurality if P-N junction performs by doping the plurality of round silicon wafers.

14. The solar cell making method of claim 1, forming of the first electrode preform and the second electrode preform is carried out by vacuum evaporating or by magnetron sputtering.

15. A solar cell system making method, comprising steps of:
  S11, making a round P-N junction preform by (a) stacking a P-type silicon layer and a N-type silicon layer on top of each other, and (b) forming a P-N junction near an interface between the P-type silicon layer and the N-type silicon layer, wherein a surface of the P-type silicon layer away from the N-type silicon layer is defined as a first surface, and a surface of the N-type silicon layer away from the P-type silicon layer is defined as a second surface;
  S12, forming a first electrode preform on the first surface and forming a second electrode preform on the second surface, thereby forming a round solar cell perform comprising the first electrode preform, the P-type silicon layer, the N-type silicon layer, and the second electrode preform arranged in the above sequence;
  S13, forming a curved photoreceptive surface with the P-N junction exposed on the curved photoreceptive surface by cutting the round solar cell preform into at least one rectangle solar cell and at least one arc shaped solar cell, the curved photoreceptive surface being on a curved surface of the at least one arc shaped solar cell and being configured to receive incident light beams;
  S14, stacking the at least one rectangle solar cell on top of each other along a first direction to form a preform, and forming a flat photoreceptive surface with the P-N junction exposed on the flat photoreceptive surface by cutting the preform along the first direction into a plurality of laminal first solar cell systems, the flat photoreceptive surface being parallel to the first direction; and
  S15, stacking the at least one arc shaped solar cell to form a second solar cell system, wherein the curved surfaces of the plurality of arc shaped solar cells the second solar cell system defines a common photoreceptive surface and a common planar surface opposite to the common photoreceptive surface, the curved surface of each of the at least one arc shaped solar cell cooperatively defines the common photoreceptive surface.

16. The solar cell system making method of claim 15, wherein cutting of the round solar cell preform comprises cutting the round solar cell perform into a square solar cell and four arc shaped solar cells, a diagonal length of the square solar cell being equal to a diameter of the round solar cell preform.

17. The solar cell system making method of claim 15, further comprising a step of forming a common transparent insulating layer on the common planar surface and forming a common reflector on the common transparent insulating layer.

18. A solar cell system making method for making solar cell, the method comprising steps of:
  S11, making a P-N junction preform by (a) stacking a P-type silicon layer and a N-type silicon layer on top of each other, and (b) forming a P-N junction near an interface between the P-type silicon layer and the N-type silicon layer, wherein a surface of the P-type silicon layer away from the N-type silicon layer is defined as a first surface, and a surface of the N-type silicon layer away from the P-type silicon layer is defined as a second surface;
  S12, forming a photoreceptive surface with the P-N junction exposed by cutting the P-N junction preform into at least one arc shaped solar cell preform comprising a curved side surface and a planar side surface opposite to the curved side surface, the photoreceptive surface being on the curved side surface; and
  S13, forming a first electrode layer on the first surface, and forming a second electrode layer on the second surface.

* * * * *